United States Patent [19]

Summach

[11] Patent Number: 5,012,042
[45] Date of Patent: Apr. 30, 1991

[54] CABLE ENTRY DEVICE FOR EMI SHIELDED CABINETS

[75] Inventor: Harley R. W. Summach, Ashton, Canada

[73] Assignee: Northern Telecom Limited, Montreal, Canada

[21] Appl. No.: 545,167

[22] Filed: Jun. 28, 1990

[51] Int. Cl.⁵ .............................................. H05K 9/00
[52] U.S. Cl. ........................ 174/35 C; 174/35 R; 439/610; 285/158
[58] Field of Search ............... 174/6, 35 R, 35 C, 50, 174/51, 52.1, 52.2, 52.3, 52.4; 285/158, 159, 160, 161, 162; 439/610

[56] References Cited

U.S. PATENT DOCUMENTS

| | | | |
|---|---|---|---|
| 3,598,895 | 8/1971 | Garland | 174/35 C |
| 4,337,989 | 7/1982 | Asick et al. | 439/610 |
| 4,440,425 | 4/1984 | Pate et al. | 285/161 |
| 4,457,576 | 7/1984 | Cosmos et al. | 439/610 |
| 4,640,569 | 2/1987 | Dola et al. | 439/610 |

Primary Examiner—Leo P. Picard
Assistant Examiner—Bot Lee Ledynh
Attorney, Agent, or Firm—Dallas F. Smith

[57] ABSTRACT

A shielded cable entry device allows direct connection to internal equipment using cables fitted with connectors at each end, while maintaining the EMI integrity of the cabinet. Two versions are disclosed. One having two body members and a securing nut. Each of the body members includes a semihexagonal flange, semicylindrical shells for making contact with the cable shielding and receiving compressing springs and a threaded section. The nut has a slot which allows it to slip onto a cable. The other having two similar body members formed from sheet metal. Each body member having semicylindrical shells for making contact with the cable shielding and receiving the springs and a folded plate flange.

5 Claims, 1 Drawing Sheet

CABLE ENTRY DEVICE FOR EMI SHIELDED CABINETS

BACKGROUND OF THE INVENTION

This invention relates to cable entry devices for cabinets and is particularly concerned with terminating cable shielding at the point of entry to maintain electromagnetic interference (EMI) shielding integrity.

Electronic apparatus is being required to meet increasingly strict EMI standards. In order to meet such standards, EMI shielding or screening of the apparatus is required, the shielding typically comprising an electrically conductive, e.g. metal, enclosure surrounding the entire apparatus.

Shielded cable entry into a cabinet designed to shield EMI presents several problems. Both the EMI shield integrity of the cable and the cabinet must be maintained. A well known technique is to terminate the shield and the conductor at the point of entry in the cabinet bulkhead by providing a feedthrough having female connectors on both sides of the bulkhead and simply running separate cables between any internal equipment and the bulkhead and from the bulkhead to any external equipment. While effective for maintaining EMI shielding integrity, this technique may not be cost effective nor space efficient.

SUMMARY OF THE INVENTION

An object of the present invention is to provide an improved shielded cable entry device.

In accordance with the present invention there is provided a cable entry device for admitting a shielded cable into an EMI shielded cabinet, comprising an electrically conductive first member including an elongate semicylindrical shell having a transverse integral flange, an electrically conductive second member similar to the first member, the members cooperating together to form, from the semicylindrical shells, an elongate cylindrical shell having an internal diameter selected to provide electrical contact with the cable shield and to form, from the integral flanges, a transverse face to abut with the cabinet, means for compressing the semicylindrical shells onto the cable shield, and means for securing the transverse face to a bulkhead of the cabinet.

An advantage of the present invention is the ability to directly connect to internal equipment using cables fitted with connectors at each end, while maintaining the EMI integrity of the cabinet.

There are a number of problems involved with shielded cable entry into an EMI cabinet. To maintain the integrity of the cabinet, the shield of the cable must make a good electrical connection with the cabinet at the point of entry. Preferably, the contact is around the entire circumference of the shield. Any hole made in the cabinet for entry of the cable and connector must be covered sufficiently to ensure the EMI integrity of the cabinet. Fixing of the cable to the bulkhead of the cabinet creates a stress point for the cable. Thus, the cable entry device should also provide stress relief at the entry point. For smaller diameter cables, and especially coaxial cables, the impedance of the cable must be maintained through the entry point. This places many restrictions on the degree of force which may be used to secure the cable at the point of entry, for example by the following techniques: crimping, clamping, soldering, and swaging.

BRIEF DESCRIPTION OF THE DRAWINGS

The present invention will be further understood from the following description with reference to the drawings in which.

Similar references are used in different figures to denote similar components.

DETAILED DESCRIPTION

Figure 1:
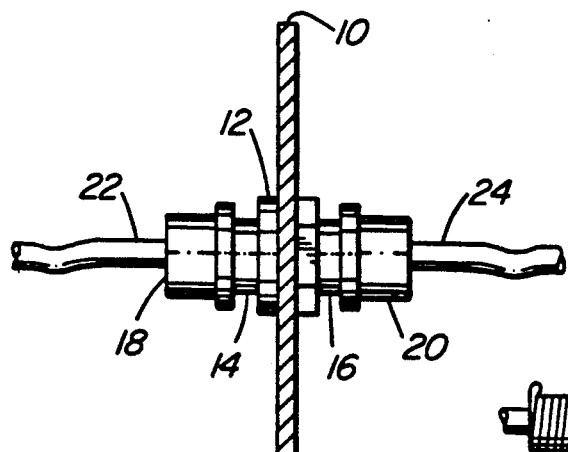
FIG. 1 illustrates in an elevation a known shielded cable entry device.

Referring to FIG. 1, there is illustrated in an elevation a known shielded cable entry device. The device is mounted on a cabinet bulkhead 10, shown in cross-section, and includes a body 12 secured to the bulkhead 10, having two female connectors 14 and 16, with one on each side of the bulkhead 10. The two female connectors 14 and 16, are provided for connection of male connectors 18 and 20 of cables 22 and 24, respectively. The shielded cable entry device provides termination of the shields of cables 22 and 24, by contact with the bulkhead 10, via the body 12. This is necessary to maintain the integrity of the cabinet and cable EMI shielding. While this type of device is effective, where large numbers of cables must enter the cabinet, e.g. telecommunications equipment cabinets, the cost of an additional connector and the device for each line may be prohibitive. Spacing between cables and access to the cables may also become a problem.

A desirable feature is the ability to directly connect to internal equipment using cables fitted with connectors at each end, while maintaining the EMI integrity of the cabinet. Cables fitted with connectors or connectorized cables provide lower cost and higher reliability than cables fitted with connectors on site.

Figure 2:
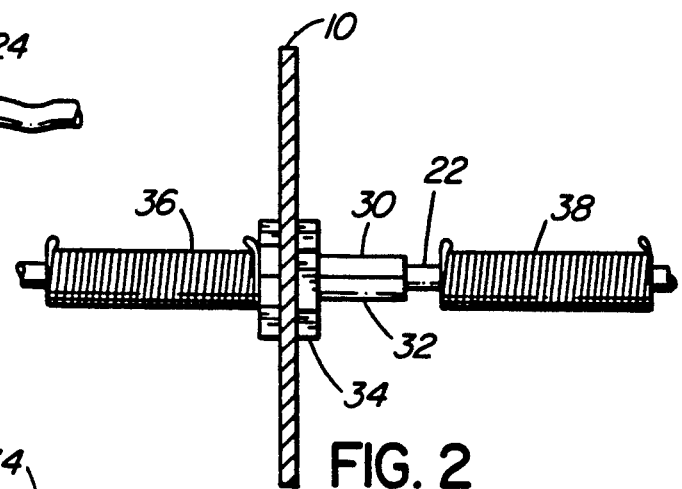
FIG. 2 illustrates in an elevation a shielded cable entry device in accordance with a first embodiment of the present invention, assembled with a cable on a cabinet bulkhead.

Referring to FIG. 2, there is illustrated in an elevation, a shielded cable entry device in accordance with a first embodiment of the present invention, assembled with a cable on a cabinet bulkhead. The device is mounted on a cabinet bulkhead 10, shown in cross-section, and includes body members 30 and 32, secured to the bulkhead 10 and each other, by a nut 34 and a spring 36. A second spring 38 is shown on the cable 22, but not yet installed on body members 30 and 32.

Figure 3:
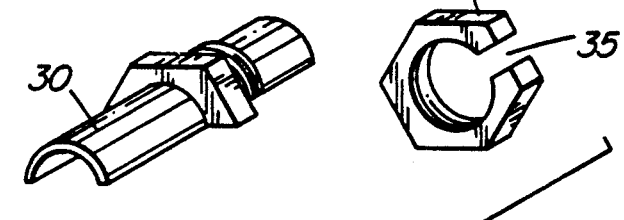
FIG. 3 illustrates in an exploded isometric view the shielded cable entry device of FIG. 2.

Referring to FIG. 3, there is illustrated, in an exploded isometric view, the shielded cable entry device of FIG. 2. The body members 30 and 32 and the nut 34 are shown. The nut 34 has a slot 35 which allows the nut 34 to slip onto the cable 22.

Figure 4:
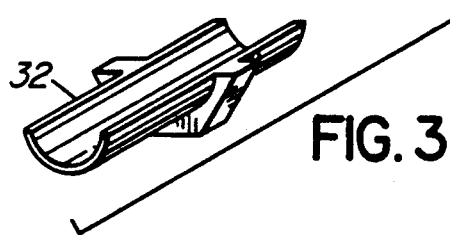
FIG. 4 illustrates in an elevation a body member of the shielded cable entry device of FIG. 2.

A body member of the shielded cable entry device of FIG. 3 is illustrated in an elevation and section in FIG. 4. The body member 30 includes a semihexagonal flange 40, semicylindrical shells 42 and 44 and a threaded section 46. The semicylindrical shells carry external circumferential ridges 48 and internal circumferential ridges 50. The body member 32 of FIGS. 2 and 3 is similar to the body member 30. The body members 30 and 32, when held together, cooperate to form a generally cylindrical shell whose interior diameter is selected to ensure a good electrical contact is made with the shielding of the cable 22 of FIG. 2. The interior ridges 50 are provided to enhance such electrical contact, but may be omitted for cables whose impedance would be affected by their presence. In place of or in addition to the interior ridges 50, piercing projections (not shown in FIGS. 2-4) may be provided. The piercing projections provide for the electrical contact between the body members 30 and 32, and the cable shield, e.g. braid of a coaxial cable, without removing the insulating covering from the cable. The exterior ridges 48 are provided to facilitate winding onto the body of springs 36 and 38.

In use, the shielded cable entry device provides termination of the shield of cable 22, by contact with the bulkhead 10, via the body members 30 and 32. This is accomplished by stripping from the cable 22 a portion of its insulating covering to expose the shield (not shown in FIG. 2). The length of exposed shield exceeds the length of the body members 30 and 32 and is less than the length of the body members 30 and 32 with the springs 36 and 38 installed. For body members 30 and 32 having piercing projections in place of or in addition to the interior ridges 50, stripping the cable of its outer insulating cover is unnecessary. To install the cable 22 and the cable entry device, first the cable is passed through a hole in the cabinet bulkhead 10. The body members 30 and 32 are placed on opposites sides of the exposed shield of the cable 22 and held while the cable 22 and body members 30 and 32 are pushed through the hole in the cabinet bulkhead 10, to expose threads 46 which receive the nut 34. The nut 34 both holds the body members 30 and 32 together and secures them to the cabinet bulkhead 10. The springs 36 and 38 are wound onto the cable, then over the semicylindrical shells 42 and 44 of the body members 30 and 32. The order of installation can be varied. For example, the spring 36 can be installed before the nut 34, thus holding the body members 30 and 32 together prior to securing to the cabinet bulkhead 10.

The springs 36 and 38 serve several functions. First, they compress together the semicylindrical shells of body members 30 and 32 to ensure good electrical contact with the cable shield. Second, they provide an overlap between body members 30 and 32 and cable shield to enhance EMI shielding. Third, they provide stress relief for the cable at the bulkhead entry point. The spring 36 also provides a means for holding together body members 30 and 32 prior to securing to the bulkhead 10 with the nut 34.

Figure 5:
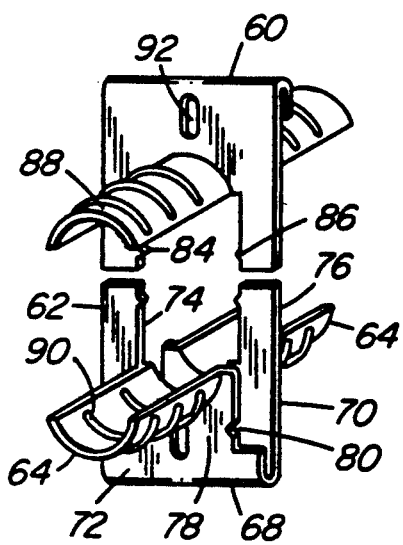
FIG. 5 illustrates in an exploded isometric view a shielded cable entry device in accordance with a second embodiment of the present invention.

Referring to FIG. 5, there is illustrated, in an exploded isometric view, a shielded cable entry device in accordance with a second embodiment of the present invention. The shielded cable entry device includes two similar body members 60 and 62 formed from sheet metal. Each body member 60 and 62 has semicylindrical shells 64 and 66 for making contact with the cable shielding and receiving the springs (not shown in FIG. 5) and a folded plate 68. The folded plate 68 includes a first plate section 70 and a second plate section 72. The first plate section 70 includes two legs 74 and 76 and the semicylindrical shell 66 upstruck therefrom, between the two legs 74 and 76. The second plate section 72 includes a central portion 78 and the semicylindrical shell 64 upstruck therefrom. The central portion 78 is sized to receive the two legs 74 and 76 of the other member and includes notches 80 and a second notch (not shown in FIG. 5) for engaging bosses 84 and 86 on two legs 74 and 76, respectively, for holding body members 60 and 62 together. The semicylindrical shells 64 and 66 carry external circumferential ridges 88 for facilitating winding the springs onto the body members and internal circumferential ridges 90 for enhancing electrical contact with the cable shield. Each body member 60 and 62 includes an elongate opening 92 through the folded plate 68 for securing to the cabinet bulkhead by means of a fastener.

Figure 6:
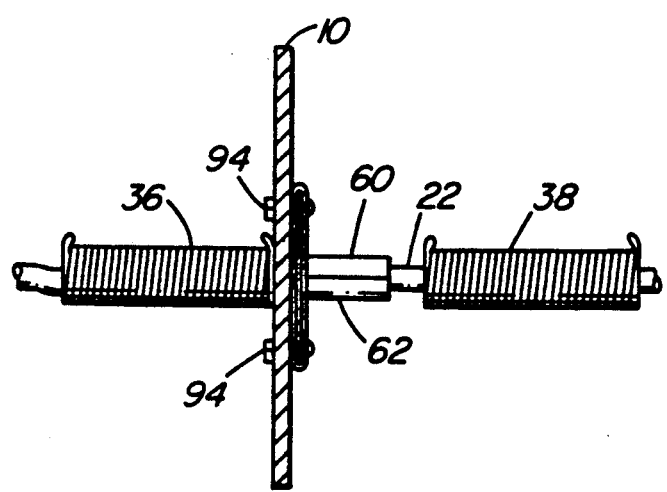
FIG. 6 illustrates in an elevation the shielded cable entry device of FIG. 5, assembled with a cable on a cabinet bulkhead.

FIG. 6 illustrates in an elevation the shielded cable entry device of FIG. 5, assembled with a cable on a cabinet bulkhead. The device is mounted on a cabinet bulkhead 10, shown in cross-section, and includes body members 60 and 62, secured to the bulkhead 10 and by fasteners 94. The spring 36 is shown in its installed position on body members 60 and 62. The second spring 38 is shown on the cable 22, but not yet installed on body members 60 and 62.

In use, the second embodiment of the shielded cable entry device of FIGS. 5 and 6 functions in a similar way to the first embodiment of FIGS. 2-5. The exceptions are the engaging of the two body members by notches 80 and the second notch and bosses 84 and 86, and the use of fasteners to attach the body members 60 and 62 to the cabinet bulkhead 10.

Numerous modifications, variations and adaptations may be made to the particular embodiments of the invention described above without departing from the scope of the invention, which is defined in the claims.

What is claimed is:

1. A cable entry device for admitting a shielded cable into an EMI shielded cabinet, comprising:

an electrically conductive first member including an elongate semicylindrical shell having a transverse integral flange;

an electrically conductive second member similar to the first member;

the members cooperating together to form, from the semicylindrical shells, an elongate cylindrical shell having an internal diameter selected to provide electrical contact with a shield of the shielded cable and to form, from the integral flanges, a transverse face to abut with the cabinet;

means for compressing the semicylindrical shells onto the shield; and means for securing the transverse face to a bulkhead of the cabinet;

wherein the means for securing comprises external threads adjacent the flange carried on the elongate semicylindrical shells and a nut for engaging the external threads and wherein the flange is positioned approximately midway along the elongate semicylindrical shells.

2. A cable entry device as claimed in claim 1 wherein the means for compressing comprises an electrically conductive coil spring.

3. A cable entry device for admitting a shielded cable into an EMI shielded cabinet, comprising:

an electrically conductive first member including an elongate semicylindrical shell having a transverse integral flange;

an electrically conductive second member similar to the first member;

the members cooperating together to form, from the semicylindrical shells, an elongate cylindrical shell having an internal diameter selected to provide electrical contact with a shield of the shielded cable and to form, from the integral flanges, a transverse face to abut with the cabinet;

means for compressing the semicylindrical shells onto the shield; and means for securing the transverse face to a bulkhead of the cabinet;

wherein the flange comprises a folded sheet metal plate including first and second plate sections, the first plate section having two legs and the semicylindrical shell upstruck therefrom, between the two legs, the second plate section having a central portion and the semicylindrical shell upstruck therefrom.

4. A cable entry device as claimed in claim 3 wherein the central portion is sized to receive the two legs of the other member.

5. A cable entry device as claimed in claim 4 wherein the central portion includes notches for engaging bosses on two legs of the other member for holding members together.

* * * * *